(12) United States Patent
Koh et al.

(10) Patent No.: US 6,445,174 B1
(45) Date of Patent: Sep. 3, 2002

(54) SLIDING TRAY HOLDER FOR EASE IN HANDLING IC PACKAGES DURING TESTING OF THE IC PACKAGES

(75) Inventors: Hock Chuan Koh, Singapore (SG); Jin Wee Lim, Singapore (SG); Yiak Khian Heng, Singapore (SG)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/101,918

(22) Filed: Mar. 20, 2002

Related U.S. Application Data

(62) Division of application No. 09/602,857, filed on Jun. 26, 2000, now Pat. No. 6,396,258.

(51) Int. Cl.[7] .............................................. G01R 31/28
(52) U.S. Cl. ..................................................... 324/158.1
(58) Field of Search ............................... 324/158.1, 765, 324/73.1; 209/571, 573, 561, 576, 599; 414/403, 404, 294, 935, 937

(56) References Cited

U.S. PATENT DOCUMENTS

| | | | | |
|---|---|---|---|---|
| 5,184,068 A | * | 2/1993 | Twigg et al. | 324/158.1 |
| 5,686,834 A | * | 11/1997 | Okudaira et al. | 324/158.1 |
| 6,124,559 A | * | 9/2000 | Heng et al. | 209/573 |
| 6,222,145 B1 | * | 4/2002 | Cook et al. | 209/573 |

* cited by examiner

Primary Examiner—Michael Sherry
Assistant Examiner—Jimmy Nguyen
(74) Attorney, Agent, or Firm—Monica H. Choi

(57) ABSTRACT

A sliding tray holder is coupled to an IC (integrated circuit) package test system having a plurality of test stations, for holding the trays of IC packages during testing of a high quantity of IC packages through the plurality of test stations. The sliding tray holder includes a platform for holding a first tray of untested IC packages and for holding a second tray of tested IC packages. Each untested IC package from the first tray of untested IC packages is loaded to at least one of the plurality of test stations for testing of the untested IC package such that the untested IC package becomes a tested IC package. The tested IC package is unloaded from one of the plurality of test stations to the second tray of tested IC packages. The platform holds the first tray of untested IC packages and the second tray of tested IC packages such that an operator does not hold the first tray and the second tray during loading of the untested IC packages to the plurality of test stations from the first tray and during unloading of the tested IC packages from the plurality of test stations to the second tray. A linear slide holds the platform and guides the platform holding the first tray and the second tray along the plurality of test stations as the platform is moved along the plurality of test stations during loading of the untested IC packages to the plurality of test stations from the first tray and during unloading of the tested IC packages from the plurality of test stations to the second tray. In this manner, the operator is relieved from constantly holding trays of IC packages during testing of a high quantity of IC packages.

7 Claims, 4 Drawing Sheets

SLIDING TRAY HOLDER FOR EASE IN HANDLING IC PACKAGES DURING TESTING OF THE IC PACKAGES

This is a divisional of an earlier filed copending patent application, with Ser. No. 09/602,857 now U.S. Pat. No. 6,396,258 filed on Jun. 26, 2000, for which priority is claimed. This earlier filed copending patent application with Ser. No. 09/602,857 now U.S. Pat. No. 6,395,258 is in its entirety incorporated herewith by reference.

TECHNICAL FIELD

The present invention relates generally to test systems for IC (integrated circuit) packages, and more particularly, to a sliding tray holder assembly that eases the handling of IC packages during testing of a high quantity of IC packages through at least one of a plurality of test stations.

BACKGROUND OF THE INVENTION

During manufacture of integrated circuits, an integrated circuit die is mounted as part of an integrated circuit package, as known to one of ordinary skill in the art of integrated circuit manufacture. The integrated circuit packages are tested for proper functionality of the integrated circuit die within the integrated circuit package, as known to one of ordinary skill in the art of integrated circuit manufacture.

Referring to FIG. 1, an IC (integrated circuit) package test system 100 of the prior art includes a plurality of test stations including a first test station 102, a second test station 104, a third test station 106, a fourth test station 108, and a fifth test station 110. Each of the test stations 102, 104, 106, 108, and 110 are coupled to a control panel 111 which includes a first indicator 112 for indicating when the first test station 102 is done testing an integrated circuit loaded therein, a second indicator 114 for indicating when the second test station 104 is done testing an integrated circuit loaded therein, a third indicator 116 for indicating when the third test station 106 is done testing an integrated circuit loaded therein, a fourth indicator 118 for indicating when the fourth test station 108 is done testing an integrated circuit loaded therein, and a fifth indicator 120 for indicating when the fifth test station 110 is done testing an integrated circuit loaded therein.

During operation of the IC package test system 100 of the prior art, an operator loads an integrated circuit package to one of the plurality of test stations 102, 104, 106, 108, and 110. Referring to FIG. 2, in the prior art, the operator holds a tray 200 containing a plurality of IC (integrated circuit) packages. The example tray 200 of FIG. 2 includes a first IC package 202, a second IC package 204, a third IC package 206, a fourth IC package 208, a fifth IC package 210, a sixth IC package 212, a seventh IC package 214, an eighth IC package 216, a ninth IC package 218, and a tenth IC package 220. A tray typically includes more numerous IC packages, but ten IC packages are illustrated in the tray 200 of FIG. 2 for simplicity of illustration.

During operation of the IC package test system 100, in the prior art, the operator holds the tray 200 with one hand and holds a suction pen 230 with the other hand. The suction pen 230 is coupled to a vacuum source for providing suction at the tip of the suction pen 230. Such suction at the tip of the suction pen 230 is amenable for picking up an IC package. Such suction pens are known to one of ordinary skill in the art of integrated circuit manufacture.

The operator picks up each of the IC packages 202, 204, 206, 208, 210, 212, 214, 216, 218, and 220 using the suction pen 230 and loads each of the IC packages to at least one of the plurality of test stations 102, 104, 106, 108, and 110. In one example embodiment of the present invention, each of the plurality of test stations 102, 104, 106, 108, and 110 are similar test stations, and each of the IC packages is tested at one of the plurality of test stations 102, 104, 106, 108, and 110.

After an IC package is loaded into one of the test stations, the operator depresses a start button on that test station to begin testing of that IC package at that test station. When that test station has completed testing of the IC package, one of the indicators 112, 114, 116, 118, and 120 corresponding to that test station turns on to indicate that the testing of the IC package is complete. For example, such an indicator may be comprised of an LED (light emitting diode) which lights up when testing of the IC package is complete.

Each indicator corresponding to a test station may also include a mechanism for indicating whether the IC package passed or failed the testing at that test station. For example, an indicator may be comprised of a first LED (light emitting diode) which lights up to a first color such as green when the IC package has passed the testing at that test station, and of a second LED (light emitting diode) which lights up to a second color such as red when the IC package has failed the testing at that test station.

During operation of the IC package test system 100, in the prior art, when testing of an IC package is complete at a test station, the operator still holds the tray 200 with one hand and holds the suction pen 230 with the other hand to unload the tested IC package from the test station for transferring the tested IC package back to the tray 200. Such loading, testing, and unloading is repeated for each of the IC packages from the tray 200. In addition, such loading, testing, and unloading is repeated for each of the. IC packages from multiple trays. A typical volume of manufacture of IC packages may be more than 7,000 IC packages per day for example. Even with such a high quantity of IC packages that are tested, an operator constantly holds a tray of IC packages in one hand and the suction pen 230 in the other hand during the repeated loading, testing, and unloading of the high quantity of IC packages to and from the test stations 102, 104, 106, 108, and 110, in the prior art.

During a work day, which may in some cases include an 8 to 12 hour work shift, the operator experiences hand fatigue in constantly holding trays of IC packages throughout the work shift. In addition with constant handling of the trays of IC packages, the IC packages may become undesirably contaminated. The hand fatigue of the operator is especially prone to result in mishandling the trays of IC packages by the operator such that the IC packages become undesirably damaged. In addition, the operator may confuse which of the IC packages of a tray have already been tested and which of the IC packages of that tray have not yet been tested. As a result, some IC packages may go untested, and time may be wasted in retesting IC packages that have already been tested.

Thus, a mechanism is desired for easing the handling of trays of IC packages during testing of a high quantity of IC packages.

SUMMARY OF THE INVENTION

Accordingly, in a general aspect of the present invention, a sliding tray holder is coupled to an IC (integrated circuit) package test system having a plurality of test stations for holding the trays of IC packages during testing of a high quantity of IC packages through at least one of the plurality of test stations.

In a general aspect of the present invention, the sliding tray lolder includes a platform for holding a first tray of untested IC packages and for holding a second tray of tested IC packages. Each untested IC package from the first tray of untested IC packages is loaded to at least one of the plurality of test stations for testing of the untested IC package such that the untested IC package becomes a tested IC package. The tested IC package is unloaded from one of the plurality of test stations to the second tray of tested IC packages. The platform holds the first tray of untested IC packages and the second tray of tested IC packages such that an operator does not hold the first tray and the second tray during loading of the untested IC packages to the plurality of test stations from the first tray and during unloading of the, tested IC packages from the plurality of test stations to the second tray.

A linear slide holds the platform and guides the platform holding the first tray and the second tray along the plurality of test stations as the platform is moved along the plurality of test stations during loading of the untested IC packages to the plurality of test stations from the first tray and during unloading of the tested IC packages from the plurality of test stations to the second tray. In this manner, the operator is relieved from holding the trays of IC packages during testing of a high quantity of IC packages.

The present invention may be used to particular advantage when the platform includes a first plurality of tray guide tabs, disposed at each of two sides toward a left portion of the platform, for holding the first tray of untested IC packages substantially centered about the left portion of the platform. The platform then also includes a second plurality of tray guide tabs, disposed at each of two sides toward a right portion of the platform, for holding the second tray of tested IC packages substantially centered about the right portion of the platform.

In addition, the platform may also include a first orientation guide pin disposed at a side of the left portion of the platform. The first orientation guide pin is aligned to fit within a first groove disposed on a side of the first tray for proper orientation of the untested IC packages within the first tray with respect to the plurality of test stations when the untested IC packages are loaded from the first tray on the platform to the plurality of test stations. In that case, the platform also includes a second orientation guide pin disposed at a side of a right portion of the platform. The second orientation guide pin is aligned to fit within a second groove disposed on a side of the second tray for proper orientation of the tested IC packages within the second tray on the platform with respect to the plurality of test stations when the tested integrated circuits are unloaded from the plurality of test stations to the second tray. With such orientation guide pins, the IC packages are easily loaded and unloaded with proper orientation within the trays on the platform with respect to the plurality of test stations.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, and 8 refer to elements having similar structure and function.

DETAILED DESCRIPTION

Figure 1:
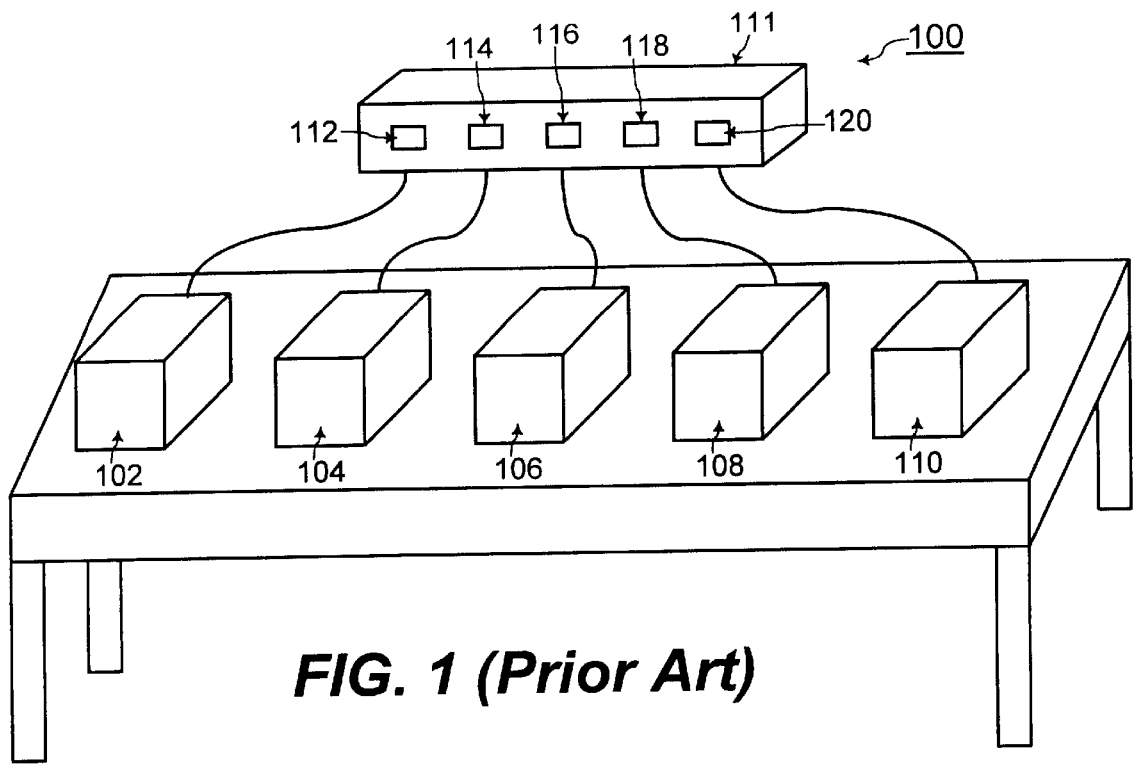
FIG. 1 shows an IC (integrated circuit) package test system having a plurality of test stations, according to the prior art.
Figure 2:
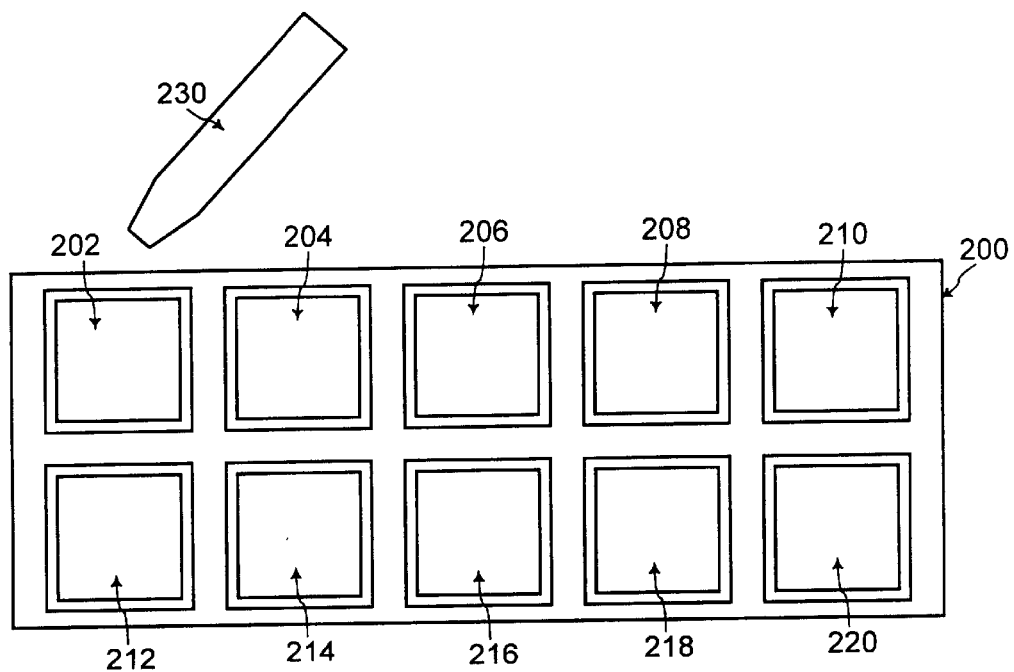
FIG. 2 illustrates a top view of a tray holding a plurality of IC (integrated circuit) packages to be tested in the plurality of test stations of FIG. 1 with a suction pen for loading and unloading of the IC packages for testing at the plurality of test stations, according to the prior art.
Figure 3:
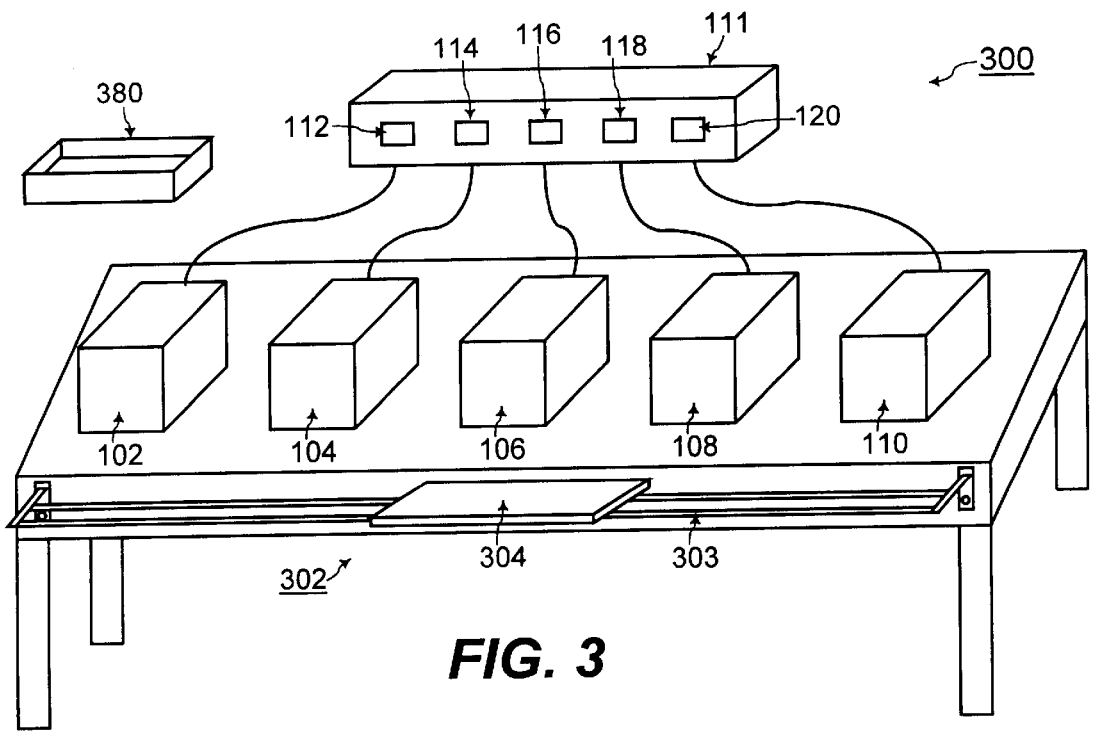
FIG. 3 shows an IC (integrated circuit) package test system having a sliding tray holder mounted thereon for ease in handling trays of IC packages during testing of a high quantity of IC packages through at least one of the plurality of test stations, according to an embodiment the present invention.

Referring to FIG. 3, for ease in handling trays of IC packages during testing of a high quantity of IC packages through at least one of the plurality of test stations 102, 104, 106, 108, and 110, an IC (integrated circuit) package test system 300 of an embodiment of the present invention includes a sliding tray holder 302 mounted thereon. Elements having the same reference number in FIGS. 1 and 3 refer to elements having similar structure and function.

Referring to FIG. 3, the sliding tray holder 302 includes a linear slide 303 mounted on the IC package test system 300 along the plurality of test stations 102, 104, 106, 108, and 110. A platform 304 is coupled to the linear slide 303 such that the linear slide 303 holds and guides the platform 304 as the platform 304 slides back and forth about the linear slide 303 along the plurality of test stations 102, 104, 106, 108, and 110.

Figure 4:
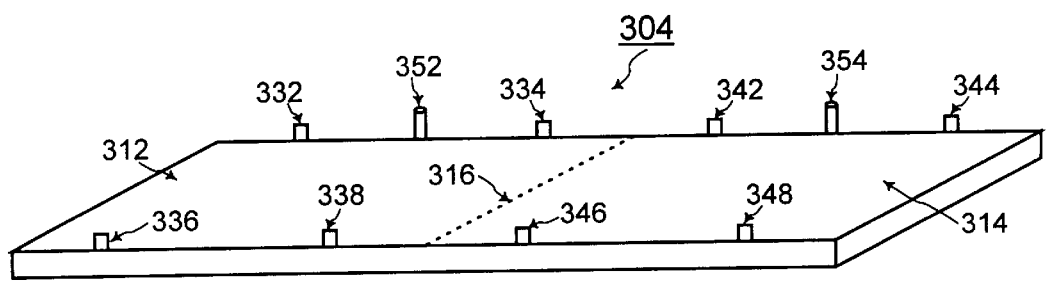
FIG. 4 shows a detailed illustration of a platform included in the sliding tray holder of FIG. 3 with tray guide tabs and orientation guide pins, according to an embodiment of the present invention.
Figure 5:
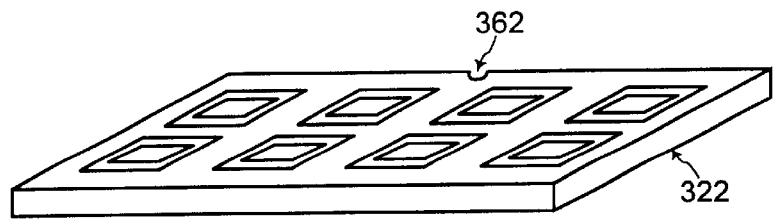
FIG. 5 shows a first tray holding untested IC (integrated circuit) packages therein when the first tray is placed on a left portion of the platform of the sliding tray holder of FIGS. 3 and 4, according to an embodiment of the present invention.
Figure 6:
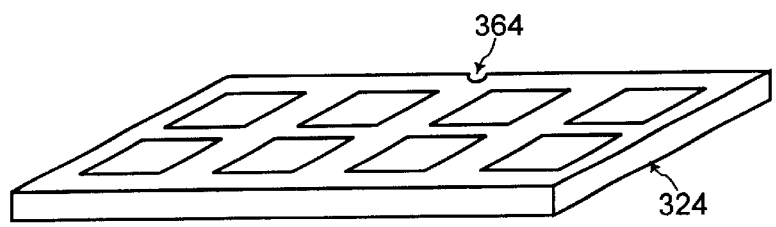
FIG. 6 shows an initially empty second tray for holding tested IC (integrated circuit) packages when the second tray is placed on a right portion of the platform of the sliding tray holder of FIGS. 3 and 4, according to an embodiment of the present invention.

Referring to FIG. 4, a detailed illustration of the platform 304 includes a left portion 312 and a right portion 314 delineated by the dashed line 316 in FIG. 4. Referring to FIG. 5, a first tray 322 of untested IC packages is initially placed on the left portion 312 of the platform 304. Referring to FIG. 6, a second tray 324 for holding tested IC packages that is initially empty is placed on the right portion 314 of the platform 304.

Figure 7:
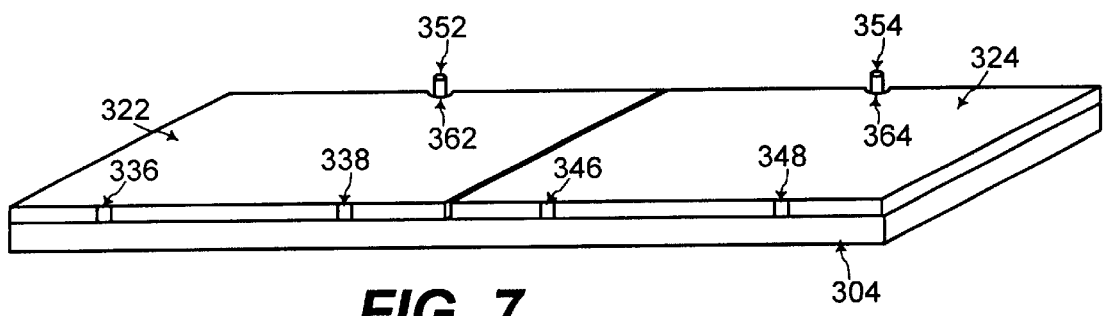
FIG. 7 shows the first tray of FIG. 5 placed on the left portion of the platform of FIG. 4 and the second tray of FIG. 6 placed on the right portion of the platform of FIG. 4.

Referring to FIG. 4, a first plurality of tray guide tabs including a first tray guide tab 332, a second tray guide tab 334, a third tray guide tab 336, and a fourth tray guide tab 338 are disposed at the two sides (i.e., the front and back sides) of the left portion 312 of the platform 304. Referring to FIGS. 4, 5 and 7, the first plurality of tray guide tabs 332, 334, 336, and 338 are designed for holding the first tray of untested IC packages 322 centered about the left portion 312 of the platform 304 and between the first plurality of tray guide tabs 332, 334, 336, and 338 (the untested IC packages are; not shown within the first tray of untested integrated circuit 322 in FIG. 7 for clarity of illustration).

In addition, referring to FIG. 4, a second plurality of tray guide tabs including a fifth tray guide tab 342, a sixth tray guide tab 344, a seventh tray guide tab 346, and an eighth tray guide tab 348 are disposed at the two sides (i.e., the front and back sides) of the right portion 314 of the platform 304. Referring to FIGS. 4, 6, and 7, the second plurality of tray guide tabs 342, 344, 346, and 348 are designed for holding the second tray 324 centered about the right portion 314 of the platform 304 and between the second plurality of tray guide tabs 342, 344, 346, and 348.

Further referring to FIG. 4, a first orientation guide pin 352 is disposed at the back side of the left portion 312 of the platform 304 facing toward the plurality of test stations 102, 104, 106, 108, and 110. Additionally, a second orientation guide pin 354 is disposed at the back side of the right portion 314 of the platform 304 facing toward the plurality of test stations 102, 104, 106, 108, and 110.

Referring to FIGS. 4, 5, and 7, the first orientation guide pin 352 is aligned to fit within a first groove 362 on the side of the first tray 322 for proper orientation of the untested IC packages within the first tray 322 with respect to the plurality of test stations 102, 104, 106, 108, and 110 when the untested IC packages are loaded from the first tray 322 to the plurality of test stations 102, 104, 106, 108, and 110. Similarly, referring to FIGS. 4, 6, and 7, the second orientation guide pin 354 is aligned to fit within a second groove 364 on the side of the second tray 324 for proper orientation of the tested IC packages within the second tray 324 with respect to the plurality of test stations 102, 104, 106, 108, and 110 when the tested IC packages are unloaded from the plurality of test stations 102, 104, 106, 108, and 110 to the second tray 324.

Referring to FIGS. 3, 5, 6, and 7, during operation of the IC package testing system 300, the first tray of untested IC packages 322 and the second tray 324 that is initially empty are placed on the platform 304. Each untested IC package from the first tray of untested IC packages 322 is loaded to one of the plurality of test stations 102, 104, 106, 108, and 110. The first tray of untested IC packages 322 rests on the platform 304, and the operator uses the suction pen 230 to pick up and load each untested IC package from the first tray of untested IC packages 322 to one of the plurality of test stations 102, 104, 106, 108, and 110. While the first tray 322 is placed on the left portion 312 of the platform 304, an untested IC package is loaded to one of the test stations 102, 104, 106, 108, and 110 from the first tray 322 with an orientation with respect to the first orientation guide pin 352 for proper loading of the untested IC package to the test station.

When an untested IC package is loaded to a test station, a start button on the test station is depressed by the operator for testing of the untested IC package at the test station. Upon completion of the testing of the IC package at the test station, the IC package becomes a tested IC package, and one of the indicators 112, 114, 116, 118, and 120 corresponding to that test station turns on to indicate that the testing of the IC package is complete. For example, such an indicator may be comprised of an LED (light emitting diode) which lights up when testing of the IC package is complete.

Each indicator corresponding to a test station may also include a mechanism for indicating whether the IC package passed or failed the testing at that test station. For example, an indicator may be comprised of a first LED (light emitting diode) which lights up to a first color such as green when the IC package has passed the testing at that test station, and of a second LED (light emitting diode) which lights up to a second color such as red when the IC package has failed the testing at that test station.

Referring to FIGS. 3, 5, 6, and 7, when testing of an IC package is complete at a test station, the operator uses the suction pen 230 to unload the tested IC package from the test station for transferring the tested IC package to the second tray 324 that holds tested IC packages. The second tray 324 rests on the platform 304:while the operator uses the suction pen 230 to pick up and unload the tested IC package from a test station to the second tray 324.

While the second tray 324 is placed on the right portion 314 of the platform 304, the tested IC package is unloaded from the test station to the second tray 324 with an orientation with respect to the second orientation guide pin 354 for proper placement of the tested IC package within the second tray 324. Referring to FIG. 3, in one embodiment of the present invention, the tested IC packages that have passed testing are placed into the second tray 324 on the platform 304 while tested IC packages that have failed testing are placed into another bin 380 placed on the side of the IC package test system 300.

Such a loading, testing, and unloading procedure is repeated for each of the IC packages within the first tray of untested IC packages 322. During such a procedure, the platform 304 holds the first tray of untested IC packages 322 and the second tray of tested IC packages 324 as each of the IC packages are loaded to and unloaded from one of the plurality of test stations 102, 104, 106, 108, and 110. Thus, the operator is relieved from holding any tray of IC packages during such repeated loading, testing, and unloading of a high quantity of IC packages.

Referring to FIG. 3, as the IC packages are loaded to and unloaded from the plurality of test stations 102, 104, 106, 108, and 110, the platform 304 slides back and forth about the linear slide 303 such that the platform 304 is near the one. of the test stations 102, 104, 106, 108, and 110 to which an untested IC package from the first tray of IC packages 322 is loaded or from which a tested IC package is unloaded to the second tray 324. Thus, since the operator slides the platform 304 for moving the tray of IC packages along the plurality of test stations 102, 104, 106, 108, and 110, the operator does not handle the tray of IC packages.

Figure 8:
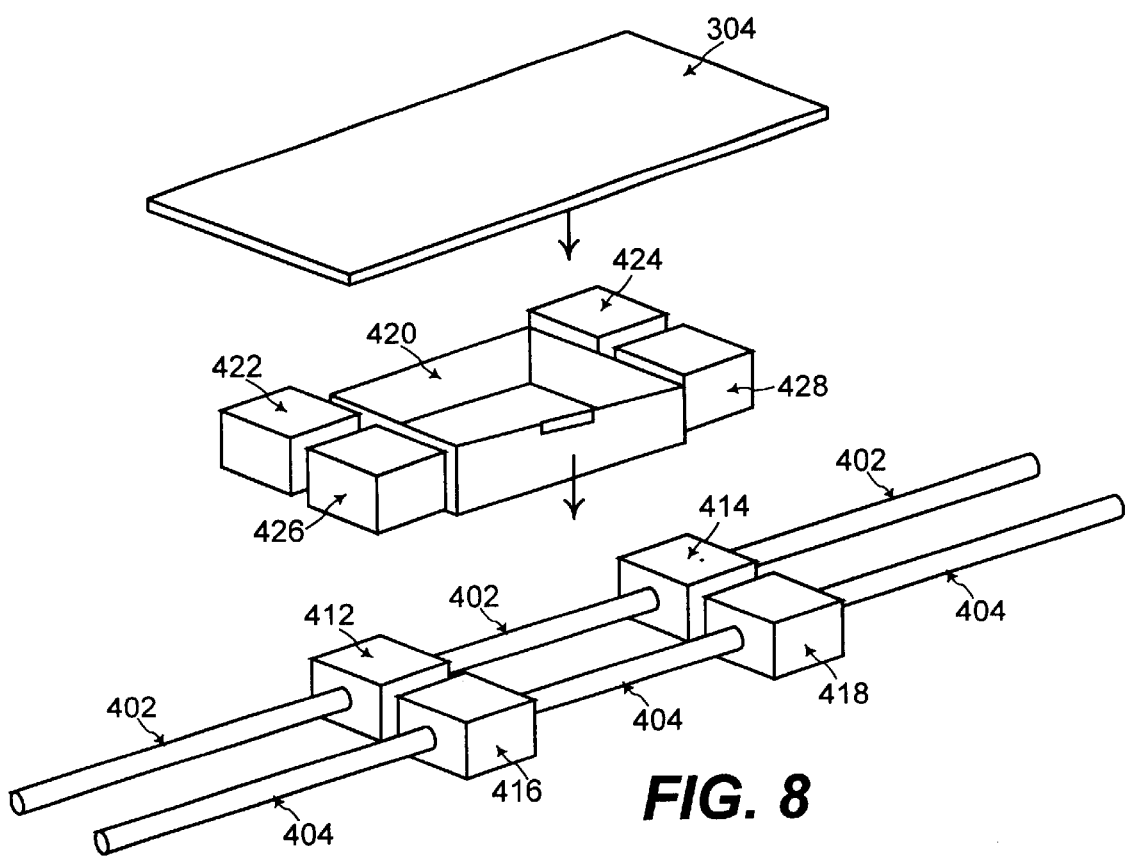
FIG. 8 shows a tool compartment and a linear slide mechanism disposed below the platform in the sliding tray holder of FIG. 3 for holding and guiding the platform along the plurality of test stations as the platform is moved along the plurality of test stations, according to an embodiment of the present invention.

The linear slide 303 holds and guides the platform 304 as the platform 304 is moved along the plurality of test stations 102, 104, 106, 108, and 110. Referring to FIGS. 3 and 8, the linear slide 303 includes a first linear guide 402 and a second linear guide 404 disposed adjacent the plurality of test stations 102, 104, 106, 108, and 110. A first linear bushing 412 and a second linear bushing 414 are disposed about the first linear guide 402. A third linear bushing 416 and a fourth linear bushing 418 are disposed about the second linear guide 404. The linear bushings 412, 414, 416, and 418 each include a contact hole disposed about the linear guides 402 and 404 and having a low friction surface for ease in sliding of the linear bushings 412, 414, 416, and 418 along the linear guides 402 and 404. Such linear bushings and linear guides are known to one of ordinary skill in the mechanical art. The platform 304 is coupled to and supported by the plurality of linear bushings 412, 414, 416, and 418 such that the plurality of linear bushings slide along the linear guides 402 and 404 when the platform 304 is moved along the plurality of test stations 102, 104, 106, 108, and 110.

Referring to FIG. 8, in another embodiment of the present invention, a tool compartment 420 is disposed beneath the platform 304 for holding tools used during testing of the IC packages. For example, the tool compartment 420 may be used to store the suction pen 230. The tool compartment 420 is surrounded by a first linear bushing support 422 which is aligned with and coupled to the first linear bushing 412, a second linear bushing support 424 which is aligned with and coupled to the second linear bushing 414, a third linear bushing support 426 which is aligned with and coupled to the third linear bushing 416, and a fourth linear bushing support 428 which is aligned with and coupled to the fourth linear bushing 418. The tool compartment 420 may slide out between the linear bushing supports 422, 424, 426, and 428. The platform 304 is coupled to and supported by the linear bushing supports 422, 424, 426, and 428.

In this manner, even though thousands of IC packages from multiple trays of IC packages may be tested during a work shift of an operator, the operator is relieved from constantly holding the trays of IC packages during the work shift and thus from hand fatigue. In addition, because handling of the trays of IC packages is minimized with the sliding tray holder, undesirable contamination and damage to the IC packages within the trays of IC packages is consequently minimized. Furthermore, with the use of the two separate trays of untested IC packages and tested IC packages, the operator is not likely to confuse which of the IC packages have already been tested and which of the IC packages have not yet been tested. Additionally, with use of the orientation guide pins, the IC packages are loaded from a tray to the test station and unloaded from a test station to the tray with proper orientation.

The foregoing is by way of example only and is not intended to be limiting. For example, the present invention may be generalized to testing a high quantity of IC packages through any types of IC package test system, as would be apparent to one of ordinary skill in the art of integrated circuit fabrication from the description herein. Furthermore, as will be understood by those skilled in the art, the structures described herein may be made or used in the same way regardless of their position and orientation. Accordingly, it is to be understood that terms and phrases such as "left," "right," "front," "back," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method for loading and unloading IC (integrated circuit) packages to and from a plurality of test stations, the method including the steps of:

placing a first tray holding a plurality of untested IC packages onto a left portion of a platform;

placing a second tray for holding tested IC packages onto a right portion of said platform;

loading each untested IC package from said first tray to at least one of said plurality of test stations for testing of said untested IC package such that said untested IC package becomes a tested IC package;

unloading said tested IC package from one of said plurality of test stations to said second tray;

and wherein said platform holds said first tray of untested IC packages and said second tray of tested IC packages such that an operator does not hold said first tray and said second tray during loading of said untested IC packages to said plurality of test stations from said first tray and during unloading of said tested IC packages from said plurality of test stations to said second tray; and moving said platform by sliding said platform along a linear slide for holding and for guiding said platform holding said first tray of untested IC packages and said second tray of tested IC packages along said plurality of test stations as said platform is moved along said plurality of test stations during loading of said untested IC packages to said plurality of test stations from said first tray and during unloading of said tested IC packages from said plurality of test stations to said second tray.

2. The method of claim 1, wherein said linear slide comprises a plurality of linear bushings disposed about a linear guide that is disposed adjacent said plurality of test stations, and wherein said platform is coupled to and supported by said plurality of linear bushings, and wherein said plurality of linear bushings slides along said linear guide when said platform is moved along said plurality of test stations.

3. The method of claim 1, further including the steps of:

holding said first tray of untested IC packages substantially centered about a left portion of said platform with a first plurality of tray guide tabs disposed at each of two sides toward said left portion of said platform; and holding said second tray of tested IC packages substantially centered about a right portion of said platform with a second plurality of tray guide tabs disposed at each of two sides toward said right portion of said platform.

4. The method of claim 1, further including the steps of:

aligning a first groove disposed on a side of said first tray to fit around a first orientation guide pin disposed at a side of a left portion of said platform for for proper orientation of said untested IC packages within said first tray on said platform with respect to said plurality of test stations when said untested IC packages are loaded from said first tray to said plurality of test stations; and aligning a second groove disposed on a si de of said second tray to fit around a second orientation guide pin disposed at a side of a right portion of said platform for proper orientation of said tested IC packages within said second tray on said platform with respect to said plurality of test stations when said tested IC packages are unloaded from said plurality of test stations to said second tray.

5. The method of claim 1, further including the step of:

storing tools used during testing of said IC packages within a tool compartment disposed beneath said platform.

6. The method of claim 5, wherein one of said tools held by said tool compartment is a suction pen used for holding said IC packages during loading of untested IC packages from said first tray to said plurality of test stations and during unloading of tested IC packages from said plurality of test stations to said second tray.

7. The method of claim 1, wherein tested IC packages that have passed testing are unloaded into said second tray, and wherein tested IC packages that have failed testing are placed into another bin.

* * * * *